United States Patent
Kao et al.

[11] Patent Number: 5,923,995
[45] Date of Patent: Jul. 13, 1999

[54] METHODS AND APPARATUSES FOR SINGULATION OF MICROELECTROMECHANICAL SYSTEMS

[75] Inventors: Pai-Hsiang Kao, Saratoga; Ranjan J. Mathew; Cornelio De Vera, both of San Jose, all of Calif.

[73] Assignee: National Semiconductor Corporation, Santa Clara, Calif.

[21] Appl. No.: 08/844,467

[22] Filed: Apr. 18, 1997

[51] Int. Cl.⁶ .................... H01L 21/301; H01L 21/46; H01L 21/78

[52] U.S. Cl. .................... 438/460; 438/462; 438/464

[58] Field of Search .................... 216/2; 438/33, 438/458, 460, 464

[56] References Cited

U.S. PATENT DOCUMENTS

| | | | |
|---|---|---|---|
| 2,818,696 | 1/1958 | Pigott | 51/267 |
| 2,851,764 | 9/1958 | White | 29/106 |
| 3,699,644 | 10/1972 | Cocca | 29/527.2 |
| 4,016,855 | 4/1977 | Mimata | 125/13 R |
| 4,387,145 | 6/1983 | Lehrer et al. | 430/5 |
| 4,612,211 | 9/1986 | Hawrylo et al. | 427/86 |
| 5,306,370 | 4/1994 | Herko et al. | 156/155 |
| 5,362,681 | 11/1994 | Roberts, Jr. et al. | 437/226 |
| 5,393,706 | 2/1995 | Mignardi et al. | 437/226 |
| 5,461,008 | 10/1995 | Sutherland et al. | 437/226 |
| 5,498,901 | 3/1996 | Chillara et al. | 257/666 |
| 5,516,728 | 5/1996 | Degani et al. | 437/227 |
| 5,573,679 | 11/1996 | Mitchell et al. | 216/2 |
| 5,593,926 | 1/1997 | Fujihira | 437/209 |
| 5,597,767 | 1/1997 | Mignardi et al. | 437/227 |
| 5,622,900 | 4/1997 | Smith | 438/464 |

*Primary Examiner*—John F. Niebling
*Assistant Examiner*—Christopher Lattin
*Attorney, Agent, or Firm*—Beyer & Weaver, LLP

[57] ABSTRACT

Disclosed are methods and apparatuses that allow the dicing of wafers containing microelectromechanical systems into singulated individual dies that is economic to use and leaves substantially no residue on the surface of the individual dies. A method for packaging the dice singulated according to the present invention is also disclosed.

13 Claims, 6 Drawing Sheets

METHODS AND APPARATUSES FOR SINGULATION OF MICROELECTROMECHANICAL SYSTEMS

BACKGROUND OF THE INVENTION

1. Field of the Invention

The present invention relates generally to microelectromechanical systems, and more particularly to methods and apparatuses for singulating dies containing a multiplicity of microelectromechanical systems (i.e., MEMS)

2. Description of the Related Art

Microelectromechanical systems are integrated micro devices or systems combining electrical and mechanical components fabricated in the similar processes to those used in the fabrication of standard integrated circuit devices. However, unlike standard integrated circuits which process electronic signals in either a digital, analog, or mixed digital/analog fashion, microelectromechanical systems are capable of and are functionally designed to generate electronic signals by their ability to undergo physical deformation or motion in response to external physical stimuli such as acceleration, external atmospheric pressure or temperature, and acoustic waves. Due to their small size and durable nature, microelectromechanical systems are capable of operation in environments that would otherwise be unsuitable for more conventional devices. Devices such as microminiature microphones, pressure gauges, accelerometers, strain gauges, bio-mechanical valves, actuators, and temperature transducers (some with critical dimensions approaching 50 microns) have become both technologically and economically feasible to produce in production quantities.

Microelectromechanical systems are fabricated in the same manner as more conventional integrated circuits using the same fabrication technology and processes. Prior to packaging, the wafer containing dies with completed microelectromechanical systems must be diced to singulate the individual dies. The standard singulation process requires a wafer saw or other methods known to those skilled in the art to physically cut the wafer along prescribed lines known in the art as "saw streets". Unfortunately, the cutting process generates a substantial amount of debris and excess thermal energy, either of which will adversely affect the number of functional dice available for final assembly. It is thus of paramount importance that this debris and excess thermal energy be removed during the dicing operation. Conventionally, a high pressure jet of water is used to clear the debris and act as lubricant as well as coolant for the wafer saw. Eventhough the high pressure jet of water effectively removes both the debris and excess thermal energy, it represents a source of damage to any structures on the surface of the wafer. Conventional methods for protecting these structures calls for the application of a substantially water insoluble protective layer covering the surface of the wafer and the microelectromechanical systems, thereon, prior to the actual sawing operation. Traditionally, this protective layer has been a substantially water insoluble photoresist which must be removed subsequent to the wafer saw operation so as to not adversely impact final assembly yield. A significant problem with use of photoresist or any other substantially water insoluble material as the protective layer is the requirement of a post saw clean operation using environmentally unfriendly solvents (i.e., acetone) to remove the protective layer from the surface of the wafer and associated microelectromechanical systems.

FIGS. 1A through 1D illustrate the conventional method of singulating dice containing microelectromechanical systems using a substantially water insoluble protective layer. FIG. 1A is a diagrammatic side view of a wafer 200 attached to a mounting tape 902 containing a plurality of dies 101 some of which have associated microelectromechanical systems 100 located on an upper surface 201 of the wafer 200 attached to mounting tape 902. The microelectromechanical systems 100 are fabricated utilizing the same or similar processes and materials as is used for fabrication of standard semiconductor circuits but are designed to generate electronic signals based upon the physical response of the structures to external physical stimuli such as pressure, temperature, acoustic waves, acceleration. FIG. 1B is a diagrammatic side view of wafer 200 attached to mounting tape 902 showing a conventional protective layer 120 covering the associated microelectromechanical systems 100. Conventional practice dictates protective layer 120 be composed of a substantially water insoluble material (such as photoresist) applied prior to the actual dicing operation. For example, a wafer saw (not shown) or any other method known in the art, scribes and cuts the wafer 200 attached to mounting tape 902 along prescribed lines well known in the art as "saw streets" 110 which delineate the boundaries of the individual dies 101. As illustrated in FIG. 1C, the wafer saw produces a die cut 130 with a depth, c, substantially cutting wafer 200 attached to mounting tape 902 leaving approximately a section of mounting tape 902 of thickness, d, as a support structure for subsequent cleaning and mounting operations performed on the singulated dies. Completion of the dicing operation requires protective layer 120 be substantially removed from the microelectromechanical systems 100 so as to not interfere with their designed function. FIG. 1D is a diagrammatic side view of wafer 200 attached to mounting tape 902 subsequent to removal of protective layer 120 but prior to final singulation of the individual dies 150 containing microelectromechanical systems 100. Unfortunately, as can be readily seen in FIG. 1D, a varying amount of substantially water insoluble protective layer 140 residue remains after the cleaning operation; the amount and location of which will ultimately determine the number of functional die available for final assembly.

In view of the foregoing, there is a need for methods and apparatuses that allow the dicing of wafers containing microelectromechanical systems into singulated individual dies that is economic to use and leaves substantially no residue on the surface of the individual dies.

SUMMARY OF THE INVENTION

In one embodiment, a method for dicing a wafer that contains a plurality of dies wherein some of the dies have microelectromechanical systems is described. The method includes the step of applying a substantially water soluble first layer to the wafer such that the layer covers the microelectromechanical systems to be protected. A substantially water insoluble second protective layer is then applied to the first protective layer prior to actual dicing the wafer along prescribed lines to form singulated individual dies. Preferably, the substantially water soluble first protective layer is removed during the cleaning operation without substantially attacking the substantially water insoluble second protective layer causing the second protective layer to detach from the first layer.

In another embodiment, a device for protecting fabricated microelectromechanical systems located on a wafer during singulation of individual dies is described. The device includes a substantially water soluble first layer that covers the microelectromechanical systems and a substantially water insoluble second layer covering the first protective layer.

In yet another embodiment of the invention, a method for dicing a wafer that contains a plurality of dies wherein some of the dies have microelectromechanical systems is described. The method includes the step of applying a substantially water soluble layer which covers the microelectromechanical systems to be protected. Then the wafer is diced to form a plurality of singulated individual dies which is followed by the cleaning process which removes the protective layer from the microelectromechanical systems.

Advantageously, the various embodiments of the present invention provide substantial protection to the microelectromechanical systems during the singulation procedure that is both inexpensive to and easy to use. Further, the ability to substantially remove all the residue from the microelectromechanical systems eliminates any reliability issue due to any remnants of protective layer left on the surface of the individual dies.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

The present invention relates to a method and an apparatus for protecting microelectromechanical systems during the singulation operation which is economical and easy to use. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1A:
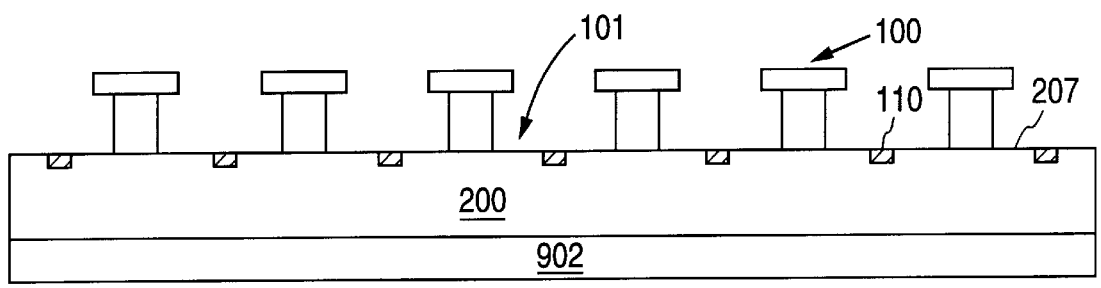
FIG. 1A is a diagrammatic side view of a wafer attached to mounting tape with associated microelectromechanical systems.
Figure 1B:
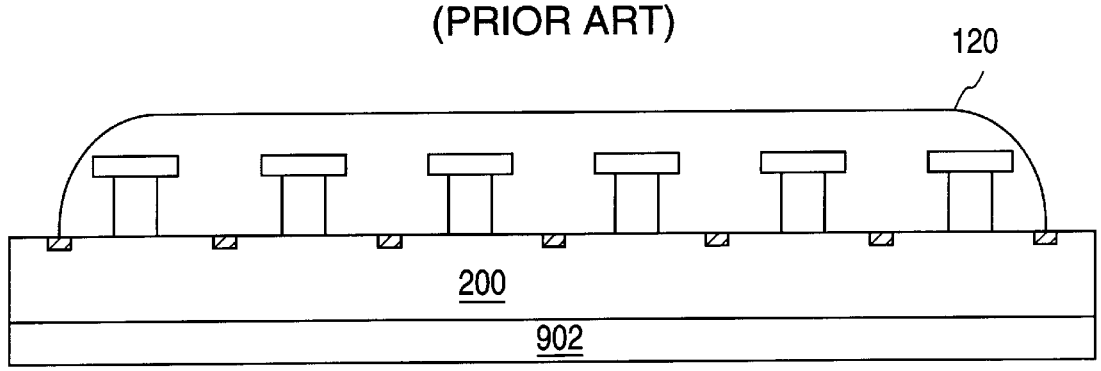
FIG. 1B is a diagrammatic side view of a wafer attached to mounting tape with a conventional protective layer covering the associated microelectromechanical systems.
Figure 1C:
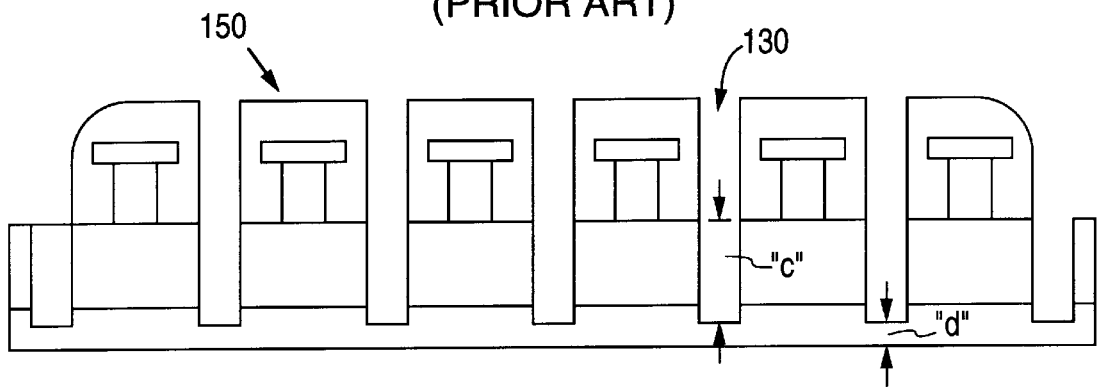
FIG. 1C is a diagrammatic side view of a wafer attached to mounting tape with associated microelectromechanical systems subsequent to the saw operation.
Figure 1D:
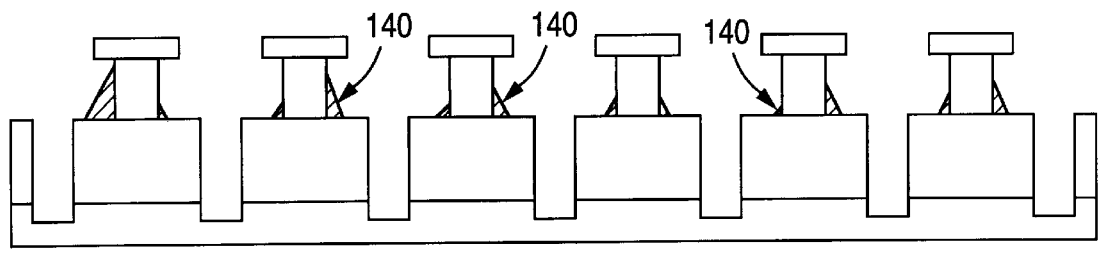
FIG. 1D is a diagrammatic side view of wafer attached to mounting tape subsequent to removal of a protective layer and prior to final singulation of the individual dies containing microelectromechanical systems.
Figure 2A:
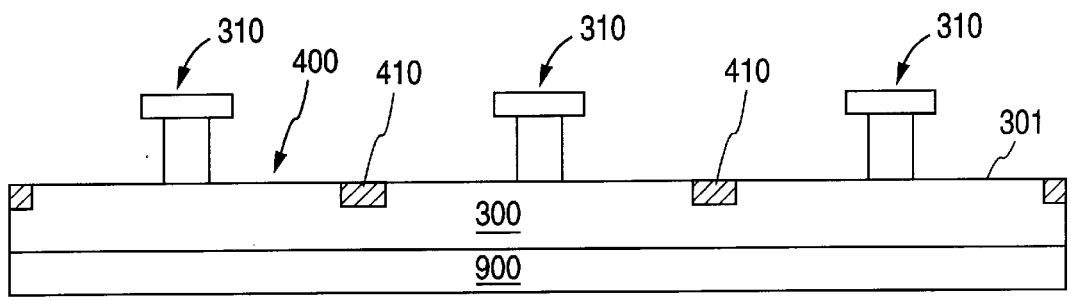
FIG. 2A is a diagrammatic side view of a wafer attached to mounting tape with associated microelectromechanical systems.
Figure 3:
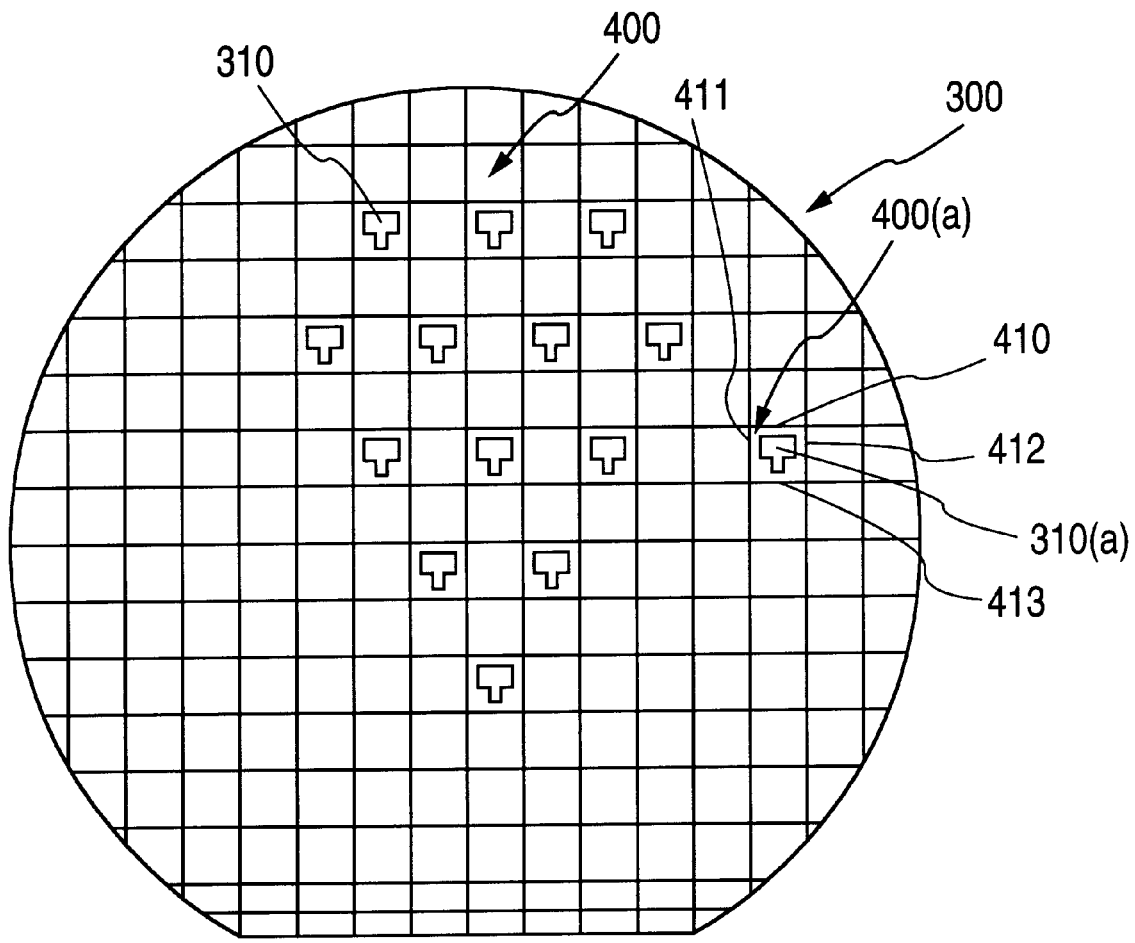
FIG. 3 is a diagrammatic top view of a wafer attached to mounting tape with associated plurality of dies some of which contain microelectromechanical systems.

A method for protecting microelectromechanical systems during the singulation operation according to the present invention is now described. In this embodiment, as illustrated in FIG. 2A and FIG. 3 a wafer 300 attached to a mounting tape 900 preferably composed primarily of silicon dioxide containing a plurality of dies 400 wherein at least some of the dies have fabricated microelectromechanical systems 310 located on a first surface 301 is provided. Conventionally, the individual dies 400 are distinguished from each other by "saw streets" 410 which delineate the boundaries of each die 400 as well as provide a guide for a sawing machine during the singulation process. By way of example, as shown in FIG. 3 saw streets 410, 411, 412, and 413, define a die area 400a, which preferably contains microelectromechanical systems 310(a). In this embodiment, a wafer saw (not shown) uses the saw streets 410–413 as guides to cut the wafer 300 attached to mounting tape 900 thereby singulating an individual die 400(a).

Figure 2B:
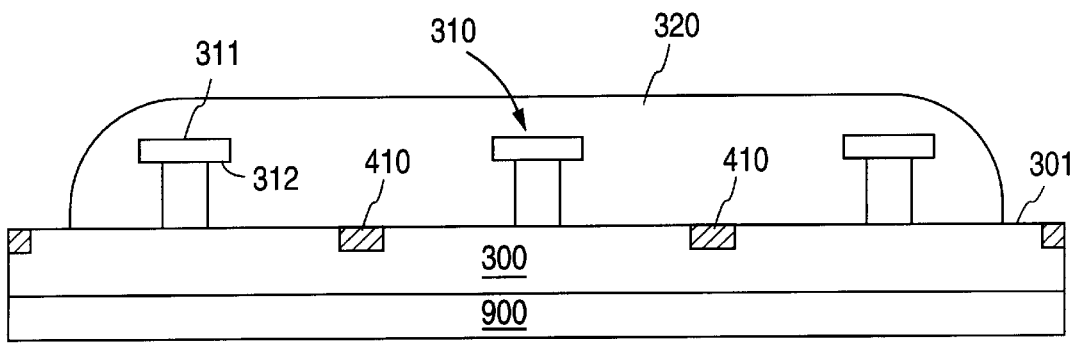
FIG. 2B is a diagrammatic side view of a wafer attached to mounting tape with a substantially water soluble first protective layer covering the associated microelectromechanical systems according to the present invention.

In accordance with this embodiment, a substantially water soluble first protective layer 320 is applied to the surface 301 of wafer 300 attached to mounting tape 900 as illustrated in FIG. 2B using any conventional process known by those of ordinary skill in the art such as spin coating. In this embodiment, the microelectromechanical systems 310 are totally enveloped by the protective layer 320; alternatively, the protective layer 320 may cover only a portion of the microelectromechanical systems. By way of example, an upper surface 311 of the microelectromechanical systems 310 may be preferentially covered with the substantially water soluble protective layer 320 leaving the underside region of the microelectromechanical system 312 free of the protective layer thereby forming a protective cap or umbrella over the microelectromechanical systems 310. Typically, substantially water soluble protective layer 320 may be approximately 2 to 5 mils in thickness, but may be any thickness required to adequately protect the surface 201 of wafer 200 attached to mounting tape 902 and associated microelectromechanical systems 310 during the actual wafer saw operation.

Figure 2C:
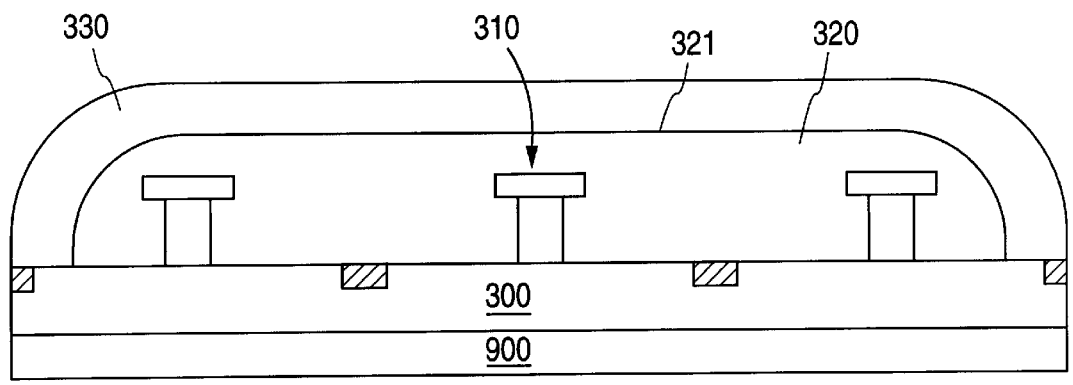
FIG. 2C is a diagrammatic side view of a wafer attached to mounting tape with a substantially water insoluble second protective layer covering a substantially water soluble first protective layer.

In the preferred embodiment, as illustrated in FIG. 2C, a substantially water insoluble second protective layer 330 is applied to the upper surface 321 of the first protective layer 320 using any conventional process known by those of ordinary skill in the art. Typically, the substantially water insoluble protective layer is generally 2 to 4 mils in thickness but may be any thickness required to adequately protect substantially water soluble first protective layer 320 during the actual wafer saw operation. The second substantially water insoluble protective layer 330 may be composed of any substantially water insoluble material known to those of ordinary skill in the art compatible with the methods, procedures, and intent herein for the process described.

The dicing device (not shown) may be any available, commercial or otherwise, for the purpose of dicing wafers, typically, this includes devices such as diamond wheel/sawing, diamond scribing, or laser scribing. The present invention can be used in conjunction with any and all such devices now or contemplated, however, strictly for illustrative purposes only, a dicing operation which utilizes a conventional wafer saw will be described. In the present embodiment, the wafer saw cuts the wafer 300 attached to mounting tape 900 in a rectilinear fashion utilizing as guides what are commonly referred to in the art as saw streets 410–413 illustrated in FIG. 3 and described above.

The wafer saw cuts the wafer using a high speed rotating blade thereby generating substantial debris from the wafer and saw blade and excess thermal energy during the cutting operation. These waste products, either separately or taken together, have the potential to substantially damage the microelectromechanical systems 310 on the surface of the wafer 300 or clog the microelectromachine structure resulting in significant yield loss. Additionally, the wafer saw requires significant cooling and lubrication so as to avoid any cracking or chipping of the wafer due to the heat generated during the sawing operation. Conventional wafer saws solve the problems of waste disposal and wafer saw blade cooling and lubrication by using a jet of high pressure water. Unfortunately, this jet of high pressure water may dissolve at least some of any unshielded substantially water soluble material used to protect the microelectromechanical systems, thereby potentially leaving the sensitive microelectromechanical systems 310 on the surface 301 of wafer 300 susceptible to damage. Advantageously, a substantially water insoluble second protective layer 330 provides the necessary protection by shielding the surface of the wafer 301 and the associated microelectromechanical systems 310 as well as the substantially water soluble first protective layer 320 from the destructive jet of high pressure water.

Figure 2D:
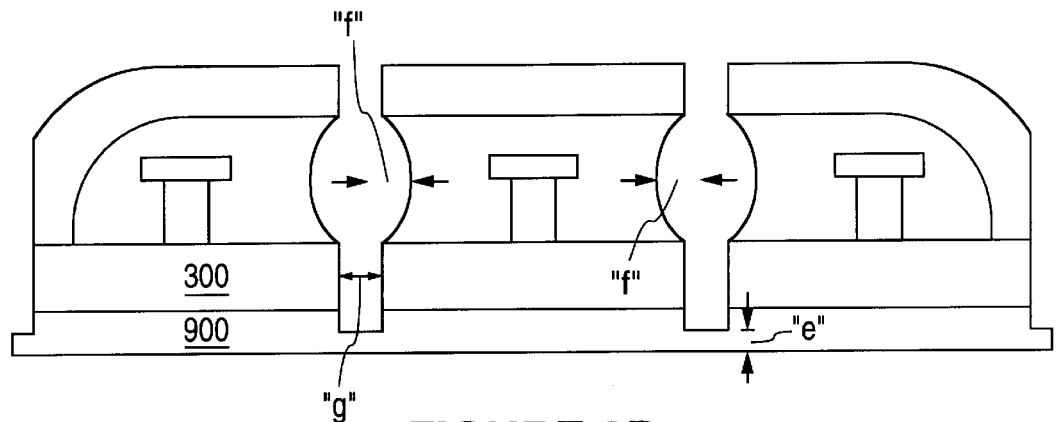
FIG. 2D is a diagrammatic side view of a wafer attached to mounting tape with associated microelectromechanical systems subsequent to a saw operation.

As illustrated in FIG. 2D, the wafer saw blade initiates the cutting operation at the top of the substantially water insoluble protective layer 330 until a portion of mounting tape 900 of thickness, e, remains which acts as a support structure for subsequent cleaning operations. Typically, thickness, e, may be on the order of 1–2 mils or any thickness as may be required by a specific tape thickness or blade to be used. The wafer saw blade generally produces a cut width, g.

The presence of the jet of high pressure water used as a coolant and lubricant for the wafer saw creates small regions of lateral undercut having dimension, f, in the substantially water soluble first protective layer 320. These undercuts generally present no problems since the distance, f, is small in comparison to the distance to the microelectromechanical systems 310.

Subsequent to the wafer saw operation, the wafer 300 attached to mounting tape 900 is preferably immersed in, sprayed with, or dipped in water, or exposed to any substance known to those of ordinary skill in the art which preferentially attacks the substantially water soluble protective layer 320 without substantially attacking the substantially water insoluble second protective layer 330. In effect, both protective layers 320 and 330 are removed in this one basic post saw clean step. As can be readily appreciated, the operational ease of removing the protective layers 320 and 330 with a simple water bath as described in accordance with this embodiment, substantially reduces the potential for yield loss due to operator handling as well as reducing overall operational expenditures and manufacturing cycle time while eliminating a potential source of environmental pollution and harmful exposure of the workers involved to toxic chemicals.

After a sufficient amount of the substantially water soluble first protective layer 320 has been dissolved by the water in the bath, the substantially water insoluble second protective layer 330 will advantageously detach from the remains of the substantially water soluble first protective layer 320 obviating the need for additional environmentally unfriendly solvents and the additional associated costs discussed above. Complete removal of the substantially water insoluble protective layer can be accomplished simply by slight agitation or spinning of the wafer, or any other means known by those skilled in the art, in the water bath.

Figure 2E:
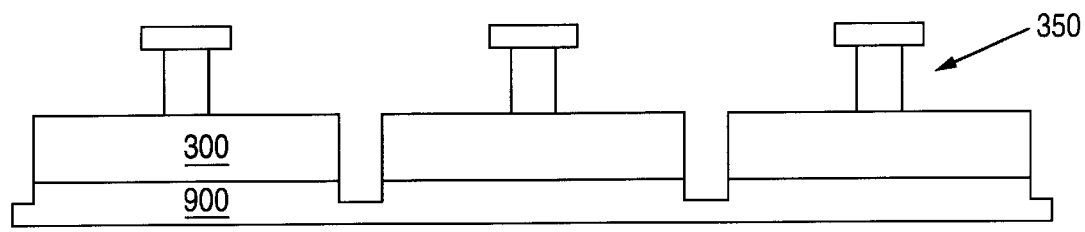
FIG. 2E is a diagrammatic side view of singulated die after post saw cleaning and separation prior to die mount and attach.

In accordance with this embodiment, any remaining substantially water soluble first protective layer 320 may then be removed from the surface of wafer 300 and microelectromechanical systems 310 thereon, by simply immersing the wafer in the water bath accompanied by simple agitation, spinning, circulating water, or any other means known by those skilled in the art resulting in substantially all residue being eliminated from the microelectromechanical systems 310. FIG. 2E illustrates the final form of the singulated die after the post saw cleaning operation prior to die attach.

Figure 4A:
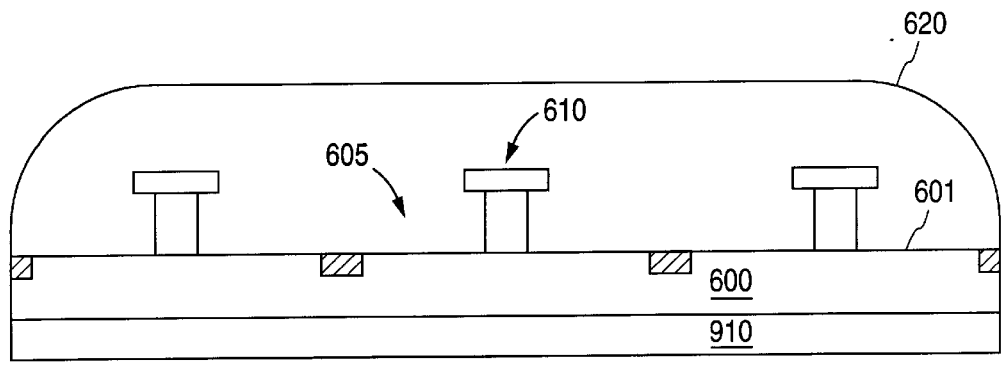
FIG. 4A is a diagrammatic cross section view of wafer attached to a mounting tape containing a plurality of die.
Figure 4B:
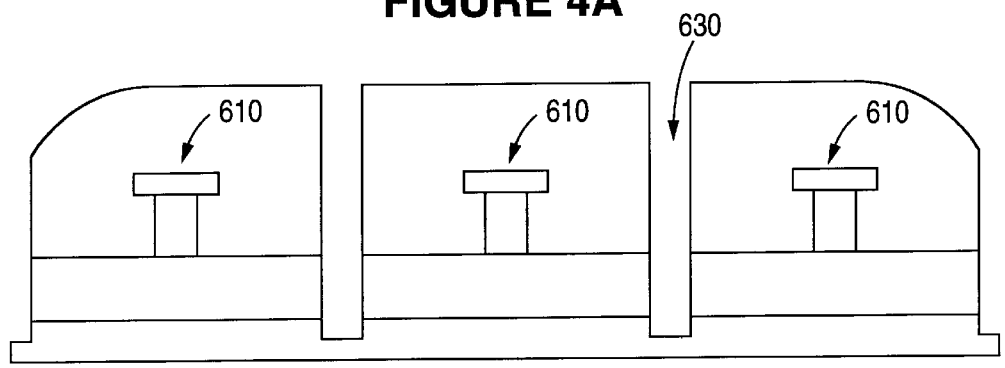
FIG. 4B is an illustration of a wafer attached to a mounting tape subsequent to the post laser cutting operation.

In yet another embodiment of the present invention, a method for protecting microelectromechanical systems during a dicing operation is disclosed. As shown in FIG. 4A a single substantially water soluble protective layer 620 is applied to a surface 601 of a wafer 600 attached to a mounting tape 910 containing a plurality of dies 605 some of which contain microelectromechanical systems 610. Any number of wafer dicing devices such as a wafer saw (described above) or a laser can be used to singulate wafer 600 attached to mounting tape 910 into individual dies wherein some contain microelectromechanical systems 610. As is well known in the art, advantages to using a laser or diamond tip in scribing wafer 600 attached to mounting tape 910 include the fact that no lubrication is required, any excess thermal energy is carried off by vaporized material ablated from the wafer itself, and little or no debris is created which may impact and damage or destroy the sensitive microelectromechanical systems 610 on the surface 601 of wafer 600 attached to mounting tape 910. With no need for a jet of water to ameliorate the problems otherwise encountered in use of a standard wafer, a single layer 620 of substantially water soluble protective layer will suffice to protect any microelectromechanical systems 610 during the scribing procedure. FIG. 4B is an illustration of wafer 600 attached to mounting tape 910 subsequent to the post laser cutting operation highlighting the wafer cuts 630 created by the laser beam vaporizing and ablating the wafer 600 attached to mounting tape 910 along the saw streets 710. As is readily apparent from FIG. 4B, since there is no jet of high pressure water, there is no concomitant lateral etch in the substantially water soluble protective layer 620.

Figure 4C:
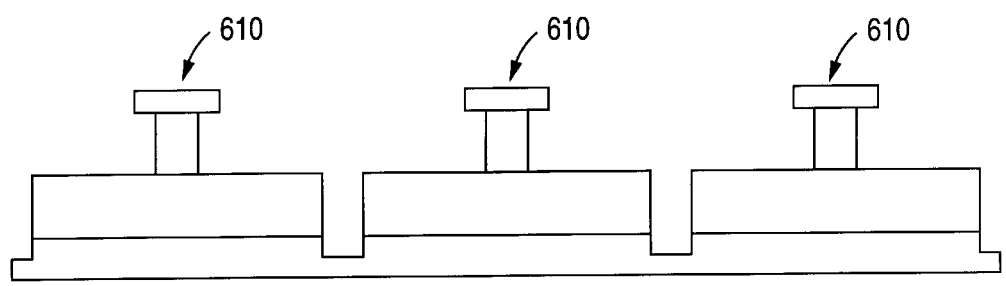
FIG. 4C illustrates a wafer attached to mounting tape subsequent to the post laser cleaning operation.

FIG. 4C illustrates wafer 600 attached to mounting tape 910 subsequent to the post laser cleaning operation in which the substantially water soluble protective layer is removed by immersing the wafer in a water bath thereby dissolving the protective layer completely. Wafer 600 attached to mounting tape 910 is preferably immersed in water or other material known by those of ordinary skill in the art which preferentially attacks the substantially water soluble protective layer 620.

In accordance with this embodiment, any remaining substantially water soluble first protective layer 620 may then be removed from the surface of wafer 600 and microelectromechanical systems 610 by simply immersing the wafer in the water bath accompanied by simple agitation, spinning, circulating water, or any other means known by those skilled in the art, thereby resulting in substantially all residue being eliminated from the microelectromechanical systems 610.

Figure 4D:
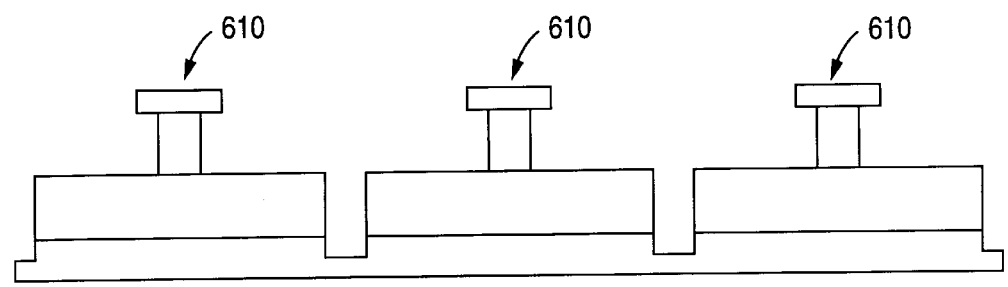
FIG. 4D illustrates the final form of singulated die after the post saw cleaning operation and final separation prior to mounting and die attach.

FIG. 4D illustrates the final form of the singulated die 610 after the post saw cleaning operation and final separation prior to die attach.

Figure 5:
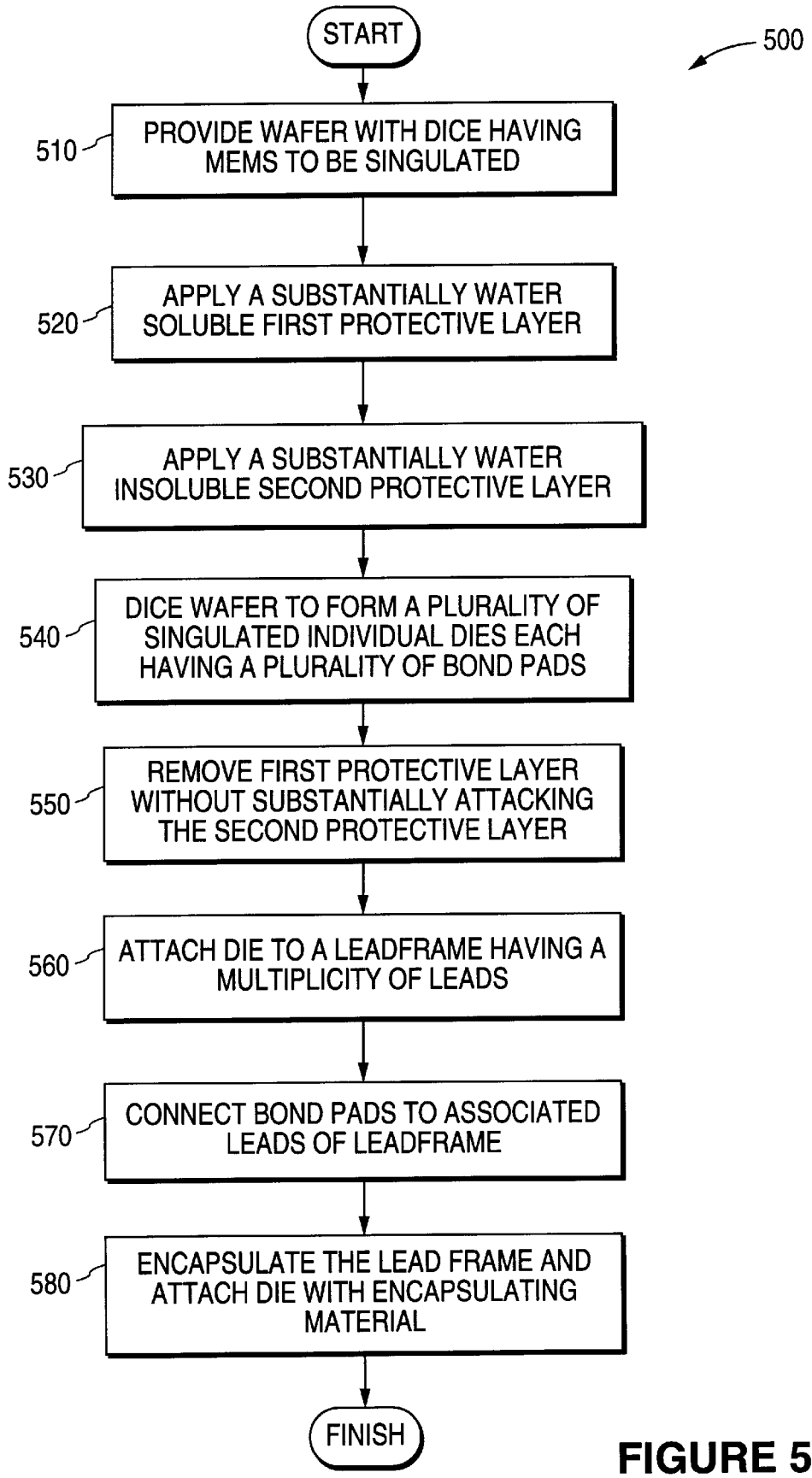
FIG. 5 is a flow chart illustrating a process for packaging a die singulated in accordance with the present invention.

FIG. 5 illustrates the process whereby a semiconductor package is formed utilizing a leadframe according to the present invention. Step 510 includes a step of providing a wafer with dies containing microelectromechanical systems to be singulated. Step 520 includes a step of applying a substantially water soluble first protective layer on the wafer so provided. Step 530 includes a step of applying a substantially water insoluble second protective layer. Step 540 includes a step of dicing the wafer to form a plurality of singulated individual dies each having a plurality of bond pads. Step 550 includes the step of removing the first protective layer without substantially attacking the second layer. Step 560 includes the method of attaching the die having the microelectromechanical systems to the die attach area of a lead frame, the lead frame having a multiplicity of leads. Step 570 includes the method of connecting the bond pads of the die with associated leads of the lead frame. Step 580 includes the method of encapsulating the combination of attached die and lead frame with an encapsulating material to create the final form of the semiconductor package utilizing the die singulated in the manner according to the present invention.

Figure 6:
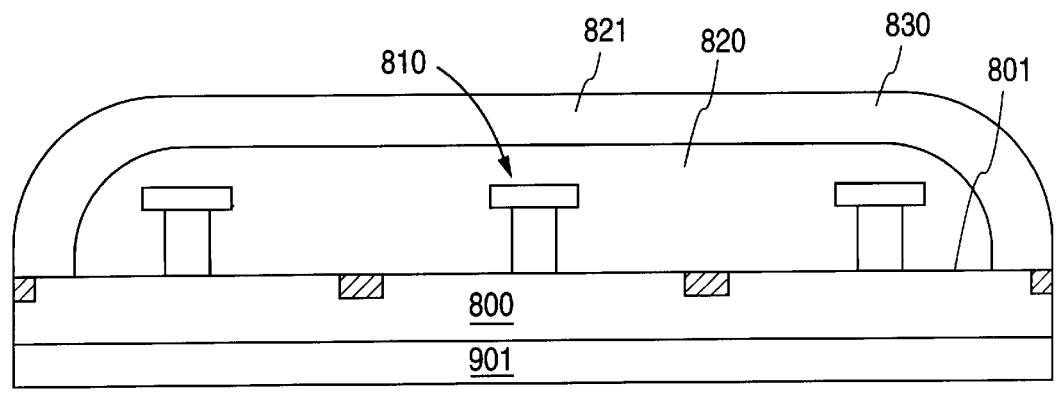
FIG. 6 illustrates a device to protect microelectromechanical systems during the singulation process consisting of a wafer and a substantially water soluble protective layer.

In still another embodiment of the invention, FIG. 6 illustrates an apparatus to protect microelectromechanical systems during the singulation process comprising a wafer 800 attached to a mounting tape 901 which contains a plurality of dies 805 wherein at least some of the dies have with fabricated microelectromechanical systems 810 located on a first surface 801 thereof and a substantially water soluble first protective layer 820 that covers the microelectromechanical systems 810. A substantially water insoluble protective layer 830 covers the upper surface 821 of the substantially water soluble first protective layer 820 providing a protective cap for the substantially water soluble first protective layer 820 and the microelectromechanical systems 810 contained therein.

Although, several embodiments of the present invention have been described in detail, it should be understood that the present invention may be embodied in many other specific forms without departing from the spirit or scope of the invention. Particularly, the wafer cutting step may be performed by other methods other then sawing or scribing. Also, future developments or improved techniques in wafer cutting can be readily incorporated in the advantages of the present invention. The present invention applies to all types of wafers where individual dice are to be singulated and is not restricted the devices described herein. Therefore, the present examples are to be considered as illustrative and not restrictive, and the invention is not to be limited to the details given, herein, but may be modified with the scope of the appended claims.

What is claimed is:

1. A method of dicing a wafer containing a plurality of dies wherein at least some of the dies have fabricated microelectromechanical systems located on a first surface thereof, the method comprising:

applying a substantially water soluble first protective layer to the wafer such that the first protective layer covers and encapsulates the microelectromechanical systems;

applying a substantially water insoluble second protective layer over the first protective layer in a manner such that the second protective layer does not contact with any of the microelectromechanical systems;

dicing the wafer to form a plurality of singulated individual dies using a water based lubricant material, wherein the dicing is done with the first and second protective layers in place to protect the microelectromechanical systems from damage during the dicing operation; and removing the first protective layer using a water based solvent after the wafer has been diced without substantially attacking the second protective layer causing the second protective layer to detach from the wafer;

whereby the second protective layer protects the first protective layer from the lubricant and the first protective layer protects the microelectromechanical systems from the second layer during the dicing operation.

2. A method as described in claim 1 whereby the step of dicing the wafer to form a plurality of singulated individual dies includes sawing the wafer along prescribed lines which define the boundaries of individual dies.

3. A method as described in claim 1 wherein the first protective layer removing step is part of a wafer cleaning operation.

4. A method of dicing a wafer containing a plurality of dies wherein at least some of the dies have fabricated microelectromechanical systems located on a first surface thereof, the method comprising:

applying a first protective layer to the wafer such that the first protective layer covers the microelectromechanical systems;

applying a second protective lay over the first protective layer, wherein the first protective layer prevents contact between the second protective layer and the microelectromechanical systems;

dicing the wafer to form a plurality of singulated individual dies; and removing the first protective layer without substantially attacking the second protective layer causing the second protective layer to detach from the wafer; and whereby the second protective layer protects the first protective layer from a lubricant used during the dicing and the first protective layer protects the microelectromechanical systems from the second protective layer.

5. A method as described in claim 4 whereby the applying a first protective layer step includes applying a substantially water soluble layer.

6. A method as described in claim 4 whereby the applying a second protective layer step includes applying a substantially water insoluble layer.

7. A method as described in claim 4 whereby the step of dicing the wafer to form a plurality of singulated individual dies includes sawing the wafer along prescribed lines which define the boundaries of individual dies.

8. A method as described in claim 4 wherein the first protective layer removing step is part of a wafer cleaning operation.

9. A method for packaging singulated dies containing a plurality of microelectromechanical systems located thereof, the method comprising:

providing a singulated die, wherein the die is singulated by dicing a wafer as described in claim 1, the die having a multiplicity of bond pads;

attaching the die to a lead frame, the lead frame having a multiplicity of leads;

connecting the bonds pads to associated leads of lead frame; and encapsulating the lead frame and attached die with encapsulating material.

10. A method as described in claim 9 whereby the encapsulating material is plastic.

11. A method of dicing a wafer containing a plurality of dies wherein at least some of the dies have with fabricated microelectromechanical systems located on a first surface thereof, the method comprising:

applying a substantially water soluble protective layer to the wafer such that the protective layer covers the microelectromechanical systems;

dicing the wafer to form a plurality of singulated individual dies; and removing the protective layer.

12. A method as described in claim 11 whereby the step of dicing the wafer to form a plurality of singulated individual dies includes sawing the wafer along prescribed lines which define the boundaries of individual dies.

13. A method as described in claim 11 wherein the first protective layer removing step is part of a wafer cleaning operation.

\* \* \* \* \*